US005880590A

United States Patent [19]
Desai et al.

[11] Patent Number: 5,880,590
[45] Date of Patent: Mar. 9, 1999

[54] APPARATUS AND METHOD FOR BURN-IN AND TESTING OF DEVICES WITH SOLDER BUMPS OR PREFORMS

[75] Inventors: Kishor V. Desai, Vestal; Joseph Hromek, Endwell, both of N.Y.

[73] Assignee: International Business Machines Corporation, Armonk, N.Y.

[21] Appl. No.: 852,770

[22] Filed: May 7, 1997

[51] Int. Cl.$^6$ .............................. G01R 31/02; H01R 9/09; H01R 23/68; H05K 1/11
[52] U.S. Cl. ......................... 324/757; 324/755; 174/261; 439/66
[58] Field of Search ................................... 324/755, 757, 324/760, 158.1; 174/250, 261; 439/65, 66, 81, 83

[56] References Cited

U.S. PATENT DOCUMENTS

| | | | |
|---|---|---|---|
| 4,251,772 | 2/1981 | Warsham et al. | 324/765 |
| 4,950,980 | 8/1990 | Pfaff | 324/755 |
| 5,118,027 | 6/1992 | Braun et al. | 228/180.2 |
| 5,196,726 | 3/1993 | Nishiguchi et al. | 257/737 |
| 5,367,253 | 11/1994 | Wood et al. | 324/158.1 |
| 5,400,220 | 3/1995 | Swamy | 174/261 X |
| 5,424,652 | 6/1995 | Hembree et al. | 324/765 |
| 5,440,240 | 8/1995 | Wood et al. | 324/765 |
| 5,459,287 | 10/1995 | Swamy | 174/266 |
| 5,475,317 | 12/1995 | Smith | 324/760 |
| 5,495,179 | 2/1996 | Wood et al. | 324/755 |
| 5,519,331 | 5/1996 | Cowart et al. | 324/755 |
| 5,523,696 | 6/1996 | Charlton et al. | 324/758 |
| 5,528,159 | 6/1996 | Charlton et al. | 324/758 |
| 5,641,945 | 6/1997 | Abe et al. | 174/261 |

OTHER PUBLICATIONS

Jim Rates, A Chronicle of Quality, Advanced Packaging, May/Jun. 1996.

Larry Gilg, Lo–Soun Su, Mark Louis, Known Good Die (KGD) Assurance Technologies: United States, Competitive Assessment, Technology Transfer # 95062882A–ENG, Sematech, Jul. 31, 1995.

*Primary Examiner*—Glenn W. Brown
*Attorney, Agent, or Firm*—Whitham, Curtis & Whitham; Larry Fraley, Esq.

[57] ABSTRACT

Temporary connections are formed to a flip-chip style chip having solder bumps or preforms protruding therefrom for testing and burn-in while avoiding distortion of the solder bumps or preforms and avoiding wear and damage to a test or burn-in jig such as a ball grid array by the use of a preferably resilient bucketed interposer which includes recesses which have a depth greater than the protrusion of the solder bumps or preforms and, preferably are narrowed at one side to a tear-drop shape. Metallization in the recesses and contacts on the interposer which mate with the test or burn-in jig are preferably textured with dendrites to be self-cleaning. A bevelled tongue and groove arrangement translates a slight compressive force to a slight shearing force between the interposer and the chip to ensure good connections to the protruding solder bumps or preforms on the chip. Any deformation of the solder bumps or preforms thus tends to only improve accuracy of positioning of the solder bumps or preforms and avoids solder voiding due to compression distortion of the solder bumps or preforms. Full burn-in and functional testing can then identify "known good" chips or dies before package completion, particularly to avoid rework of modular circuit packages.

13 Claims, 1 Drawing Sheet

SECTION "3"-"3" TOP VIEW

APPARATUS AND METHOD FOR BURN-IN AND TESTING OF DEVICES WITH SOLDER BUMPS OR PREFORMS

BACKGROUND OF THE INVENTION

1. Field of the Invention

The present invention generally relates to the manufacture of semiconductor integrated circuit packages and, more particularly, to burn-in and testing of chips prior to packaging, especially multi-level modular packaging.

2. Description of the Prior Art

The many and complex steps for formation of integrated circuits on semiconductor wafers which are later diced into chips or dies assures that manufacturing yield of the chips or dies will seldom be 100% even though the technology has become quite sophisticated and process conditions and tolerances can be much better controlled and regulated than in the very recent past. However, each process step or group of process steps carries a cost and it would be desirable to remove defective chips from the process at as early a point in the manufacturing process as possible.

On the other hand, testing and inspection during relatively early stages of manufacture is, itself, costly and the cost of individual testing and inspection procedures diminishes somewhat as the chip package becomes more complete. Cost of testing also increases with thoroughness of testing at any stage of production and at early stages in particular since more thorough testing generally requires more connections to be made to the chip and exercised during testing while structures for making convenient and reliable connections to the chip have generally not been formed. Thus, increasing the number or thoroughness of test procedures early in the manufacturing process rapidly produces diminishing returns and a trade-off remains between the expense of further processing of chips beyond the point at which a defect is created (or could potentially be detected) and the cost of more thorough and frequent testing at early stages of production. Even if optimized, the cost of further processing of defective chips and reduced manufacturing yield based on tests which are, in fact, performed is a significant portion of the cost of manufacturing integrated circuits.

Of course, over small batches of chips or wafers, small process variations beyond the available level of process parameter regulation causes variation in manufacturing yield which prevents quantitative optimization of the number, thoroughness and points during manufacture of the tests conducted. Generally, a testing strategy is assumed and its effectiveness evaluated over a number of batches of completed chip packages to refine the strategy in view of the types of defects later discovered to reduce or compromise manufacturing yield. This approach has led to a strategy in which, for single chip packages, only screening for catastrophic defects is done at various points during manufacture before the chip package is completed.

In recent years, however, performance enhancements and manufacturing economies have led to the design of so-called multi-layer modular (MLM) packaging of integrated circuits in which a single package includes a potentially unlimited plurality of chips (which may be formed by incompatible technologies) and complex circuitry to interconnect the chips formed on surfaces of and vias in lamina which are later bonded together to form the MLM.

While some rework of these modular packages is possible, including replacement of chips therein which are later found to be defective, such rework carries its own costs and process complexities. Further, even if the manufacturing yields of individual chips is high, the number of chips included in the package will increase the likelihood that one or more chips must be replaced in any given module. Rework, itself, can cause chip damage or other damage such as solder voiding for the replaced chip which would require a further rework procedure. For this reason, the concept of the "known good die" (KGD) could potentially produce reduction of overall manufacturing costs of advanced integrated circuit packages by potentially avoiding processing or rework costs with full functional testing prior to package completion.

Another complexity is presented by the fact that some change in manufacturing yield will occur during an initial period of operation of an integrated circuit. That is, a definition of a "known good die" which is based on whether or not it functions correctly the first time it is operated may not be sufficient to obtain the potential benefits of avoiding rework. Completed packages are generally subjected to a "burn-in" period of operation and further testing to determine actual operating characteristics and to project whether or not the package will remain reliably functional and within operating margins. It appears that rework can only be avoided in a sufficient number of cases to be economically favorable if burn-in and full functional testing are performed to determine a "known good die" prior to completion of the integrated circuit package.

Some efforts toward burn-in and testing of chips prior to package assembly have been attempted in designs using lead frames to mount and form connections to a chip. However, in MLMs, a so-called "flip-chip" mounting arrangement is much preferred. "Flip-chip" mounting involves the attachment of solder bumps or preforms such as so-called C4 (controlled collapse chip connections) preforms to connection pads on a major surface of the chip and then inverting the chip and attached preforms for mounting to a mirror-image array of connection pads of a substrate (e.g. another chip, MLM, carrier, board or the like) by heat treatment that forms reliable solder connections between the substrate and chip. To date, this structure has required solder attachment to a testing apparatus or compressional connection against pads to which the package would otherwise be soldered. In either case, some degree of deformation of the solder bumps or preforms inevitably occurs (possibly aggravated by high chip temperature during burn-in operation and/or testing) and solder voids and other connection defects generally result due to such deformations when the chip is later assembled with and soldered to a package structure.

Additionally, it is customary to make temporary connections to chips through use of a so-called ball grid array (BGA) chip carrier. A BGA is a substrate having plated areas on both sides thereof. Plated areas on one side are arrayed for attachment of a chip by soldering, compression and/or other arrangements. Plated areas on the other side are provided for the attachment of contact balls to make temporary contacts or to be soldered to a testing and/or burn-in apparatus. Connections between plated areas of opposite sides of the BGA are connected by plated through-holes (PTH).

For flip-chips having solder bumps or solder preforms (hereinafter sometimes collectively referred to as "protrusions"), the through holes serve to receive the bumps or preforms along the annular edge of the PTH for a relatively reliable connection under compression. However, the reduced contact area along such an annulus may aggravate deformation of the solder bumps or preforms. More economically significant, however, is the fact that BGAs are very high precision components which are very expensive and yet very subject to wear and damage and generally have a short useable lifetime.

To date, no alternatives to soldering or compressional connection have been proposed which accommodate the extremely close spacing of contact pads on flip-chip style chips while supporting the extended duration of connections required for burn-in operation and full functional testing. Similarly no arrangements for extending the usable life of ball grid arrays while providing connections to flip-chips have been proposed.

SUMMARY OF THE INVENTION

It is therefore an object of the present invention to provide a system for temporary connection of a flip-chip style chip to apparatus allowing burn-in operation and testing.

It is another object of the invention to provide an arrangement for avoiding damage to and deformation of solder bumps and preforms while making temporary electrical connections thereto.

It is a further object of the invention to provide an arrangement for avoiding compressional forces between a chip and a temporary connection apparatus.

It is yet another object of the invention to provide an arrangement for reliably providing a connection on a flip-chip to a ball grid array while preventing wear and damage to the ball grid array.

In order to accomplish these and other objects of the invention, an apparatus for making temporary connections between a test or burn-in jig and a chip having protrusions thereon is provided including an interposer having recesses thereon at locations corresponding to locations of protrusions on the chip and metallization within recesses having a depth greater than a height of the protrusions, connections from the metallization to contacts corresponding to contacts on the test or burn-in jig, and an arrangement for urging the protrusions against lateral sides of the recesses.

In accordance with another aspect of the invention, a method of making temporary connections to protrusions on a chip is provided including the steps of assembling a chip with a bucketed interposer and a test or burn-in jig such that recesses in the bucketed interposer receive the protrusions without the protrusions bearing on bottoms of the recesses and contacts on the interposer bear against contacts on the test or burn-in jig, and applying a shearing force between at least the chip and the interposer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
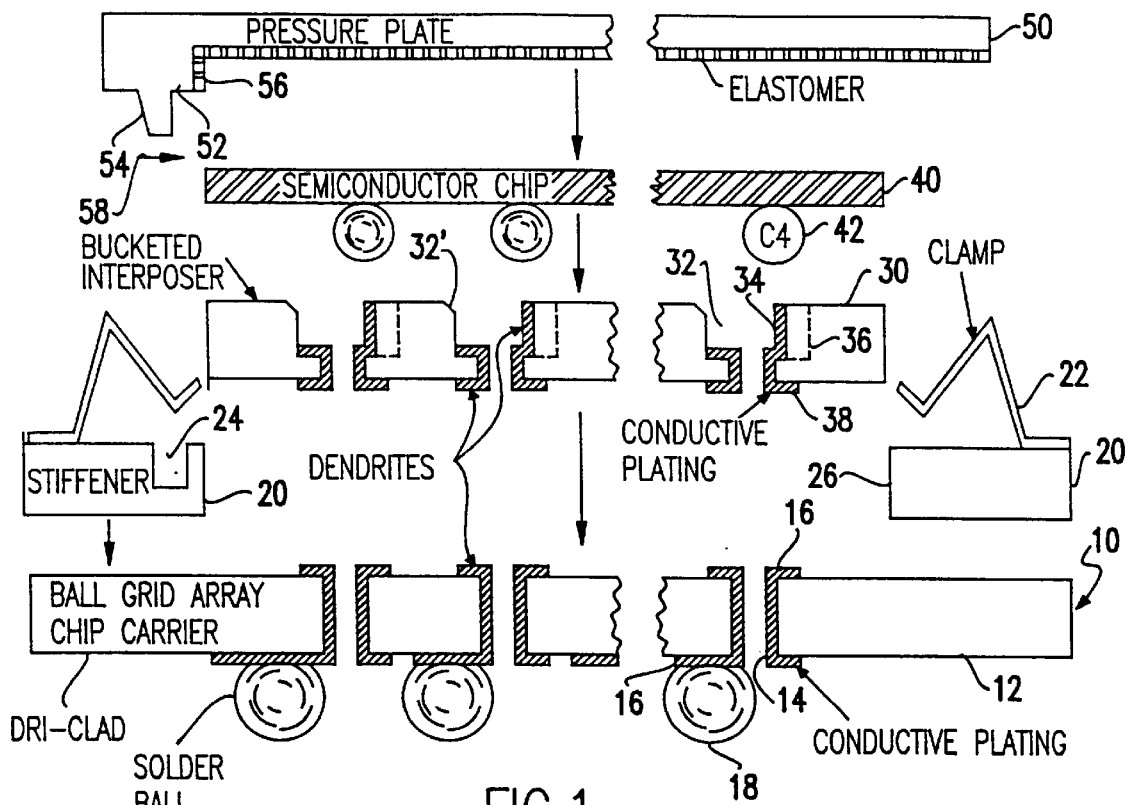
FIG. 1 is a cross-sectional exploded view of a preferred form of the invention.

Referring now to the drawings, and more particularly to FIG. 1, there is shown an exploded cross-sectional view of a preferred form of the invention. Starting at the bottom level of the exploded view, ball grid array (BGA) chip carrier 10 is shown. The BGA illustrated is exemplary of such structures which are known in the art and which are usable with or in the invention. The BGA, insofar as its structure is relevant to the practice of the present invention, includes a substrate 12, plated through-holes (PTH) 14, and plated pads 16 which may include a connection 16' of any desired length to a corresponding PTH. The plated pads on the underside of the BGA serve for the mounting of a grid array of balls or solder preforms 18 by which temporary or substantially permanent connections are made to apparatus for burn-in and/or functional testing, as alluded to above. Such structures will generally be common to other types of test connector pads and jigs with which the invention is also useable, as well.

It should be noted that the balls or solder preforms 18 on the BGA are substantially larger than the solder bumps or preforms 42 on chip 40, which will be discussed below. In fact, the difference in size of the balls or preforms may be very much greater than is illustrated in FIG. 1. Typically, the balls or preforms 18 on the ball grid array will be about 25–30 mils in diameter while the solder bumps or preforms 42 on chip 40 are sized in accordance with the design rules of the chip and, in current designs, may be only about 1–2 mils across. Smaller sizes of solder bumps or preforms 42 may be anticipated in future designs. By the same token, while the pitch of solder bumps or preforms 42 on the chip 40 and the pitch of balls 18 on BGA 10 are illustrated as being about the same, in practice, the respective pitches may be similarly disparate. To accommodate these differences and also accommodate any differences in location of power and signal connections between balls 18 and solder bumps 42, conductor 16' may be of a substantially elongated and possibly tortuous form.

In accordance with the invention, the BGA is modified by the attachment of or integral formation with stiffeners 20 at least at opposing ends of the BGA. Adhesives such as epoxy and cyanoacrylate adhesives and the like are suitable for the purpose and the adhesive is not critical to the practice of the invention. Likewise, the material of the stiffeners is not at all critical to the practice of the invention but materials which have a coefficient of thermal expansion similar to that of substrate 10 are preferred. In addition to opposing ends of the BGA any additional portion of the periphery may have similar stiffeners formed thereon or applied thereto as may be desired.

The stiffeners are provided with retainer springs 22 which need only provide a very light force against a pressure plate 50 when the arrangement in accordance with the invention is assembled. Specifically, the only compressive force which is important to the practice of the invention (which seeks to avoid significant compressive forces) functions merely to urge bevelled tongue 54 on the L-shaped end 52 of pressure plate 50 into groove 24 located with reference to the BGA, preferably by being formed in a stiffener 20 or, alternatively, on said interposer (or vice-versa), such that a small lateral force will be developed urging pressure plate 50 in the direction indicated by arrow 58. Other arrangements for achieving the same simple function will be evident to those skilled in the art in view of these alternatives. A resilient elastomer lining 56 is provided on the interior of pressure plate 50 to distribute any remaining compressive force evenly over the upper and an end surface of chip 40, either of which may exhibit some degree of irregularity.

The invention further provides an interposer sheet 30 which may be relatively rigid but preferably is of a resilient material which can be deformed slightly by lateral forces developed by bevelled tongue 54 and groove 24, as discussed above. The amount of deformability should be comparable to the degree of precision in the formation of recesses 32 therein or precision of location of solder bumps or preforms 42 on a chip and, if the material provides even slight resilience, interposer 30 need not be of high precision and can be fabricated at low cost.

Figure 3:
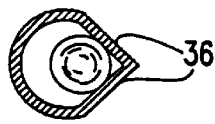
FIG. 3 is a view of an aperture in an interposer sheet in accordance with the invention which is taken along section 3—3 of FIG. 2.

Recesses 32 in the interposer sheet 30 (sometimes referred to hereinafter as a bucketed interposer in view of the recesses) are preferably of a "tear-drop" shape; being generally circular but having a narrowed region of the periphery, preferably forming two angled walls as indicated at 36, better shown in plan or section (3—3) view in FIG. 3. The narrowed portion or angled walls 36 are plated with a metal 34 and the metal is carried through a plated through hole and on the lower surface to form pads 38 in a continuous connection. When assembled, pads 38 mate with and form an electrical connection to pads 16 of BGA 10. The tops of the recesses 32 are preferably chamfered as shown, for example at 32' to more readily guide solder bumps or preforms 42 into the recesses or buckets 32.

It should be noted that since these pads are of the same planar shape and have a relatively large bearing surface against each other and, further, are subjected to little compressive force therebetween, damage or wear on the BGA chip carrier is much reduced. Wear on the BGA chip carrier can be further reduced with conductive lubricants and/or by using a relatively softer metal (e.g. silver or gold) or alloy for pads 38 or a plating thereon than for pads 16. Additionally, renewable surface plating with a metal or alloy can be used for either set or both sets of pads.

In any event, it is advantageous and preferred to use a mixture of metals having a limited mutual solubility (e.g. copper and tin) so that upon simple heat treatment and cooling dendrites of at least one of the metals will form in the metallization. Dendrites are essentially elongated crystals of a metal which is forced out of solution with change of temperature and thus forms a roughened texture to the metal surface which tends to pierce any oxidation which may be present on a contacting surface. Provision of dendrites in the metal pads thus makes the connections essentially self-cleaning and improves the reliability of temporary connections so made.

Figure 2:
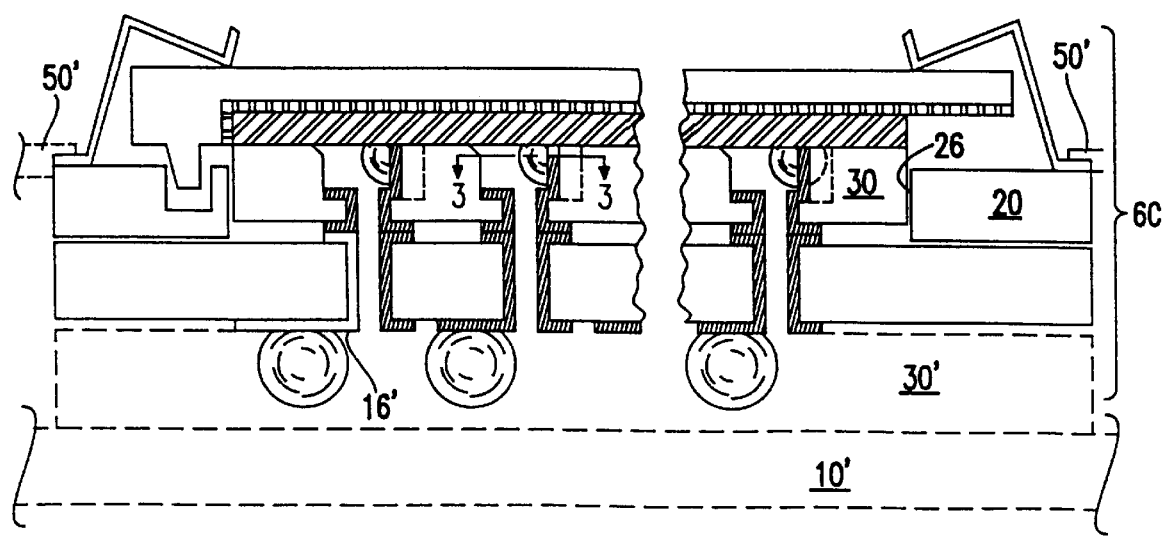
FIG. 2 is a cross-sectional view of a preferred form of the invention as illustrated in FIG. 1 and assembled with a flip-chip.

Referring now in more detail to FIG. 2, the assembly of a flip-chip including exemplary C4 solder preforms with a ball grid array chip carrier is shown. While assembly order is not particularly critical to the practice of the invention, it is preferred to assemble interposer 30 with the modified ball grid array 10, 20 (the prior addition or formation of the stiffeners 20 to BGA 10 in accordance with the invention being assumed) since the stiffeners 20 will provide a guide for placement of the interposer 30 on the BGA. Alignment of pads 16 and 38 is preferably achieved by this guide function of stiffeners 20. Further, the interposer sheet 30 is preferably of slightly greater thickness than stiffeners 20 for reasons which will be more fully discussed below.

This increased thickness provides a slight upstanding edge of the interposer sheet above the stiffeners and correct seating of the interposer 30 against the BGA will be evident therefrom. Further, since the interposer 30 is preferably somewhat resilient, assembly with the more rigid BGA will provide some support and dimensional stability which may be of assistance in assembling the chip thereto. Additionally, since the interposer 30 will preferably be of similar dimension to the chip to be installed thereon, the relatively larger BGA and/or the upstanding edge of the interposer 30 can both facilitate and/or guide assembly with the chip.

The bare flip-chip with solder bumps or preforms thereon can then be assembled with the interposer 30. As alluded to above, recesses or buckets 32 are chamfered to facilitate this process and make assembly somewhat self-aligning. Once the flip-chip 40 is placed on the interposer, it is covered by pressure plate 50 which is lined with a resilient material to compensate for dimensional irregularities of the chip and the assembly is secured together as a unit by the placement of the free ends of springs 22 against a surface of pressure plate 50 to apply a very slight compressive force between the BGA 10 and pressure plate 50.

As the pressure plate is assembled with the remainder of the components, bevelled tongue 54 is placed into groove 24. The slight compressive force of springs 22 urges the inclined surface of bevelled tongue 54 against an edge of the groove 24. This bearing surface translates the slight compressive force into a slight shearing force in the direction of arrow 58 which is transmitted to the edge of chip 40 by the L-shaped configuration 52 of pressure plate 50. L-shaped configuration 52 of the pressure plate 50 preferably engages only the chip through a resilient lining 56 and does not engage interposer 30.

By the same token (e.g. by the preferred greater thickness of interposer 30 relative to stiffener 20), the opposite edge of interposer 30 is laterally supported by stiffener edge 26. The small lateral force thus developed by spring 22, bevelled tongue 54 and groove 24, as described above, thus resolves into a small shearing force between the chip 40 and interposer sheet 30 which serves to seat solder bumps or preforms 42 against conductive material 34 on the narrowed portion or angled surfaces 36 of tear-drop shaped recesses or buckets 32 on interposer 30.

It should be noted in this regard that the solder bumps or preforms 42 do not reach the bottoms of recesses or buckets 32 (e.g. the buckets or recesses on the interposer are of a depth greater than the height of the solder bumps or preforms) and the lower surfaces are thus not subject to damage or deformation by any contact. Therefore, the problem of later solder voiding due to solder bump or preform deformation when the chip is soldered to a substrate is avoided. On the contrary, while any variation in positioning of the solder bumps or preforms 42 is taken up by the resilience of the interposer 30 so that reliable electrical contact can be made, any deformation of the solder bumps or preforms which occurs tends to correct any variation from ideal positioning of the solder bumps or preforms on the chip.

Additionally, any wear or damage due to attachment to the flip-chip is carried entirely by the inexpensive interposer 30 rather than the expensive ball grid array or other type chip carrier 10. The flip-chip does not directly contact the chip carrier at any time and many chips insertions can be performed on the interposer for each assembly or insertion of the interposer with the precision and expensive BGA.

Further, it will be appreciated that the assembled chip, pressure plate, interposer and ball grid array forms a module 60 of substantially similar topology and geometry as the chip itself, although of substantially increased dimensions. Therefore, the module 60 could be temporarily mounted on another ball grid array or carrier 10', preferably by application of the principles of the invention as described above for attaching a chip 40 to BGA 10 through use of a further bucketed interposer 30' to avoid wear and damage on both chip carriers. Preferably, and additional pressure plate 50' would be aperture and engage only stiffeners 20 of ball grid array 10 to avoid compressional forces on the chip 40. Any number of such ball grid arrays or other chip carriers could be used and use of two or more chip carriers provides the advantages of accommodating a plurality of pitches of connections at various levels and complexity of connections which could result from a single large change of connection pitch. Further, use of two or more chip carriers presents additional layers of connections which can be used to simplify provision of adaptations for different patterns and locations of signal and power connections on the chip relative to connections on a test or burn-in jig.

In view of the foregoing, it is seen that the use of an interposer 30 having recesses for engaging lateral surfaces of solder bumps or preforms on flip-chips together with provision for developing a small lateral force from a small compressive force which need be no more than that necessary to secure the assembly together, avoids distortion, deformation and damage to the solder bumps or preforms thus eliminating problems of solder voiding and, in fact, tends to correct variation in placement thereof toward ideal locations. Contact of the solder preforms on two sides of the narrowed portions or angled surfaces of recesses in the interposer sheet provides secure and reliable temporary electrical connections to support burn-in and full functional testing, avoiding the need for formation of a more permanent connection and may even improve heat transfer to the BGA. Damage and wear on the expensive BGA is much reduced through both the avoidance of contact with solder bumps or preforms of the flip-chip and the potentially reduced number of insertions of the interposer 30 on the BGA relative to the number of chip insertions on the interposer 30.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. Apparatus for making temporary connections between a test or burn-in jig and a chip or module having protrusions thereon, said apparatus including an interposer having recesses thereon at locations corresponding to locations of said protrusions on said chip or module and metallization within said recesses, said recesses having a depth greater than a height of said protrusions, means for forming connections from said metallization in respective ones of said recesses to contacts corresponding to contacts on said test or burn-in jig, and means for urging said protrusions against lateral sides of respective ones of said recesses.

2. Apparatus as recited in claim 1, wherein said recesses are tear-drop shaped.

3. Apparatus as recited in claim 2, wherein said recesses have two sides which are angled toward each other.

4. Apparatus as recited in claim 1, wherein an upper edge of one of said recesses is chamfered.

5. Apparatus as recited in claim 1, wherein said means for urging said protrusions against said lateral sides of said respective ones of said recesses includes a groove located at a fixed location relative to one of said interposer and said test or burn-in jig, a bevelled tongue on a pressure plate, and means for urging said bevelled tongue into said groove.

6. Apparatus as recited in claim 1, wherein said means for urging said protrusions against said lateral sides of said respective ones of said recesses includes a groove located at a fixed location relative to said test or burn-in jig, a bevelled tongue on a pressure plate having a portion shaped to engage said chip, means located on said test or burn-in jig to engage a lateral side of said interposer, and means for urging said bevelled tongue into said groove.

7. Apparatus as recited in claim 1, wherein said test or burn-in jig is a ball grid array.

8. Apparatus as recited in claim 1, wherein said means for forming connections includes a metal or alloy which is soft relative to said contacts of said test or burn-in jig.

9. Apparatus as recited in claim 1, wherein at least one of said metallization in said recesses and said means for forming connections has a self-cleaning texture formed by dendrites.

10. Apparatus as recited in claim 1, wherein said interposer is sufficiently resilient to deform by an amount equal to tolerance of location accuracy of said protrusions in response to said means for urging said protrusions against lateral sides of respective ones of said recesses.

11. A method of making temporary connections to protrusions on a chip or module including the steps of assembling said chip or module with a bucketed interposer and a test or burn-in jig such that recesses in said bucketed interposer receive said protrusions without said protrusions bearing on bottoms of said recesses and contacts on said interposer bear against contacts on said test or burn-in jig, and applying a shearing force between at least said interposer and said chip or module.

12. A method as recited in claim 11, wherein said step of applying a shearing force includes the further steps of inserting a bevelled tongue into a groove, and applying a compressive force to a pressure plate engaging at least an edge of said chip urging said bevelled tongue into said groove.

13. A method as recited in claim 11, including the further step of deforming said interposer against respective ones of said protrusions with said shearing force.

* * * * *